(12) United States Patent
Haid et al.

(10) Patent No.: US 7,549,066 B2
(45) Date of Patent: Jun. 16, 2009

(54) AUTOMATIC POWER SAVINGS STAND-BY CONTROL FOR NON-VOLATILE MEMORY

(75) Inventors: Christopher John Haid, Folsom, CA (US); Enrico David Carrieri, Rancho Cordova, CA (US)

(73) Assignee: Intel Corporation, Santa Clara, CA (US)

(*) Notice: Subject to any disclaimer, the term of this patent is extended or adjusted under 35 U.S.C. 154(b) by 328 days.

(21) Appl. No.: 10/295,436

(22) Filed: Nov. 15, 2002

(65) Prior Publication Data

US 2005/0086548 A1 Apr. 21, 2005

(51) Int. Cl.
G06F 1/26 (2006.01)
G06F 1/32 (2006.01)
G06F 13/00 (2006.01)
G11C 5/14 (2006.01)
G11C 8/18 (2006.01)

(52) U.S. Cl. ............... 713/320; 713/401; 713/340; 713/324; 711/102; 711/103; 365/229; 365/233.5; 365/227

(58) Field of Classification Search ............... 711/103, 711/102; 713/320, 324, 340, 401; 365/229, 365/233.5, 227
See application file for complete search history.

(56) References Cited

U.S. PATENT DOCUMENTS

| | | | | |
|---|---|---|---|---|
| 3,859,638 A | * | 1/1975 | Hume, Jr. ............... | 365/229 |
| 4,644,494 A | | 2/1987 | Muller | |
| 5,167,024 A | * | 11/1992 | Smith et al. ............. | 713/322 |
| 5,404,543 A | | 4/1995 | Faucher et al. | |
| 5,428,579 A | | 6/1995 | Robinson et al. | |
| 5,430,859 A | * | 7/1995 | Norman et al. ........... | 711/103 |
| 5,508,971 A | | 4/1996 | Cernea et al. | |
| 5,677,522 A | * | 10/1997 | Rice et al. ............... | 235/454 |
| 5,724,592 A | | 3/1998 | Garner | |
| 5,941,990 A | * | 8/1999 | Hiiragizawa ............. | 713/310 |
| 6,122,221 A | * | 9/2000 | Rezeanu ................. | 365/233.5 |
| 6,205,084 B1 | * | 3/2001 | Akaogi .................... | 365/233 |

(Continued)

FOREIGN PATENT DOCUMENTS

WO  WO 01/50268  7/2001

(Continued)

OTHER PUBLICATIONS

A multipage Cell Architecture for High-Speed Programming Multilevel NAND Flash Memories; Nov. 8, 1998.*

Primary Examiner—Hyung S Sough
Assistant Examiner—Mardochee Chery
(74) Attorney, Agent, or Firm—Ling Hong

(57) ABSTRACT

A non-volatile memory array such as a flash memory array may include a power savings circuit to control a stand-by mode of the non-volatile memory array. The power savings circuit may cause a placement of the non-volatile memory array into a stand-by mode in the absence of activity on at least one or more inputs of the non-volatile memory array. Power may be saved automatically without processor intervention by reducing the operating current of the non-volatile memory array. The automatic power savings circuit may provide a chip enable output to an input of stand-by circuitry to control the operation of the standby circuitry without requiring an explicit stand-by command from a processor.

19 Claims, 2 Drawing Sheets

U.S. PATENT DOCUMENTS

| | | | |
|---|---|---|---|
| 6,275,421 B1 * | 8/2001 | Chen et al. | 365/189.06 |
| 2002/0024884 A1 | 2/2002 | Roohparvar | |
| 2002/0071331 A1 * | 6/2002 | Al-Shamma et al. | 365/227 |
| 2003/0151957 A1 * | 8/2003 | Pekny | 365/189.11 |

FOREIGN PATENT DOCUMENTS

| | | |
|---|---|---|
| WO | PCT/US03/34233 | 10/2003 |

* cited by examiner

AUTOMATIC POWER SAVINGS STAND-BY CONTROL FOR NON-VOLATILE MEMORY

DESCRIPTION OF THE DRAWING FIGURES

The numerous advantages of the present invention may be better understood by those skilled in the art by reference to the accompanying figures in which.

DETAILED DESCRIPTION

Figure 1:
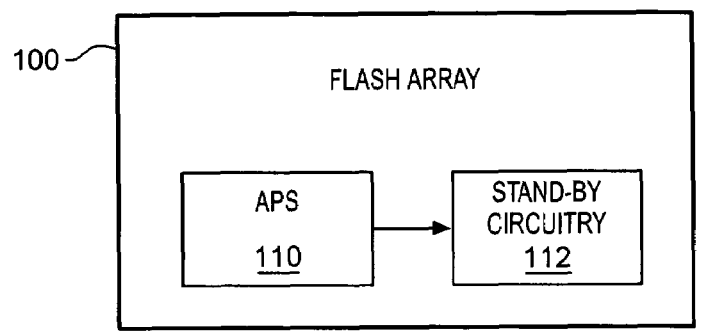
FIG. 1 is a block diagram of a non-volatile memory array such as a flash memory array utilizing a power savings stand-by mode in accordance with one embodiment of the present invention.

Referring now to FIG. 1, a non-volatile memory array such as a flash array utilizing automatic power savings stand-by control in accordance with the present invention will be discussed. In one embodiment of the invention, a non-volatile memory may refer to a type of memory that retains information in the absence of power being applied to the memory. In one embodiment of the invention, stand-by may refer to a power saving mode or state, although the scope of the invention is not limited in this respect. For example, in a stand-by mode, power may be saved automatically without processor intervention by reducing the operating current of the non-volatile memory array, although the scope of the invention is not limited in this respect.

As shown in FIG. 1, a flash array 100 may include stand-by circuit or circuitry 112 for placing flash array 100 into a stand-by mode. In one embodiment of the invention, stand-by circuitry 112 may place flash array 100 into a stand-by mode in order to reduce power consumption of flash array 100 by reducing operating current, although the scope of the present invention is not limited in this respect. An automatic power savings circuit (APS) 110 may couple with stand-by circuitry 112 to cause stand-by circuitry 112 to place flash array 100 into a stand-by mode automatically without requiring processor input or interaction, and as a result may result in a power savings, although the scope of the present invention is not limited in this respect. Although the invention discusses a flash array for purposes of illustration, the scope of the invention is not limited in this respect, and the invention may be extended to other memory technologies. In one embodiment of the invention, APS 110 and stand-by circuitry 112 may be separate circuits, and in another embodiment of the invention APS 110 and stand-by circuitry 112 may be a single circuit, although the scope of the invention is not limited in this respect. Furthermore, in another embodiment of the invention, either or both of APS 110 and stand-by circuitry 112 may be disposed within flash array 100, or alternatively, either or both of APS 110 and stand-by circuitry 112 may be disposed externally to flash array 100, although the scope of the invention is not limited in this respect.

Figure 2:
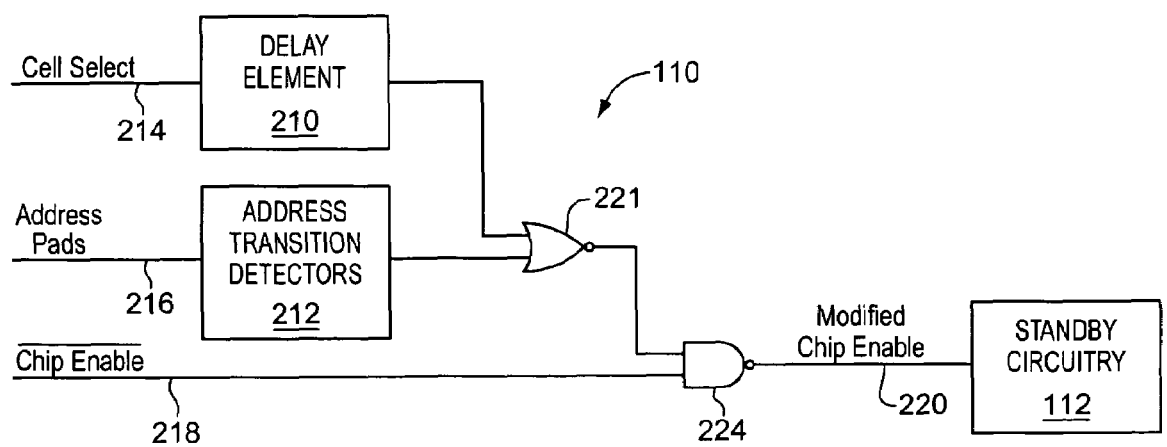
FIG. 2 is a block diagram of a power savings circuit to control a stand-by mode in accordance with one embodiment of the present invention.

Referring now to FIG. 2, a diagram of an automatic power savings circuit in accordance with the present invention will be discussed. In one embodiment of the invention, APS 110 may cause stand-by circuitry 112 to place flash array 100 in a stand-by mode when the processor is not toggling the inputs of flash array 100. In one embodiment of the invention, toggling may refer to activity on an input such as an address line of flash array 100, and when a processor is not toggling the inputs of flash array 100 in one embodiment may refer to a lack of activity on an input or an address line of flash array 100, optionally for a predetermined period of time, although the scope of the invention is not limited in this respect.

A chip enable input 218 may be utilized by APS 110 to determine whether to control the operation of stand-by circuitry 112 to place flash array 100 into stand-by mode. In one embodiment of the invention, APS 110 may modify a signal on chip enable input 218 to provide a modified chip enable input 218 provided to stand-by circuitry 112. In one embodiment of the invention, chip enable input 220 to stand-by circuitry 112 may also be a chip enable output 220 of APS 110 where the output of APS 110 is coupled to the input of stand-by circuitry 112, although the scope of the invention is not limited in this respect. When flash array 100 is disabled via chip enable input 218, the output of APS 110 may be ignored. When flash array 100 is enabled via chip enable input 218, APS 110 may control chip enable input 218 for stand-by circuitry 112. In one particular embodiment, APS 110 may operate as a control circuit to control stand-by circuitry 112 as shown in FIG. 1, although the scope of the present invention is not limited in this respect.

Figure 3:
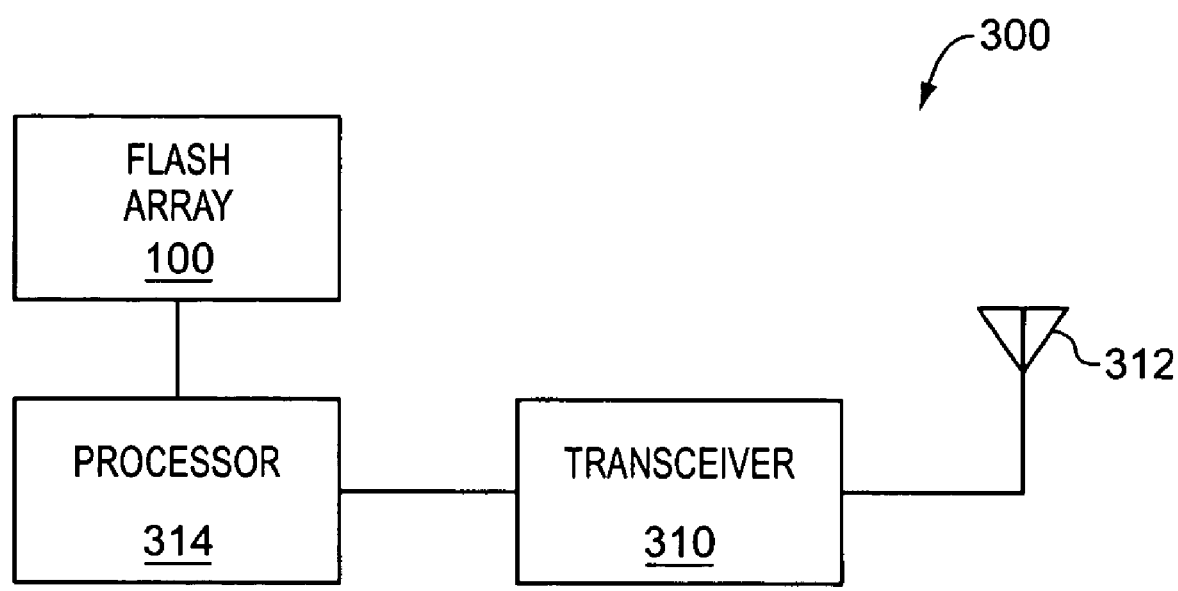
FIG. 3 is a block diagram of a wireless device incorporating a non-volatile memory array such as a flash memory array utilizing a power savings stand-by mode in accordance with one embodiment of the present invention.

When the processor is not changing the inputs of flash array 100, for example the addresses, address transition detector (ATD) circuits 212 may not generate any pulses, for example when there is no change in signal at address pads 216. No change in the signal at address pads 216 may indicate that processor 314 as shown in FIG. 3 is done using flash array 100 for that operation, for example processor 314 may not be reading from or writing to flash array 100, or may not be providing address activity on the address lines. In such an embodiment, processor 314 may not be required to explicitly instruct flash array 100 to enter a stand-by mode since APS 110 detects that ATD circuits 212 have not generated a pulse, and APS 100 may automatically cause stand-by circuitry 112 to go activate stand-by mode, although the scope of the present invention is not limited in this respect.

In one particular embodiment, flash array 100 may enter a stand-by mode before a read instruction is complete. In such an embodiment, a cell select input 214 may also be used. In the event flash array 100 is selected via cell select input 214, the execution of an instruction may be indicated so that flash array 100 should not go into a stand-by mode until any read instruction is complete. Once the flash array 100 has been deselected via cell select input 214, and ATD circuits 212 are not generating any pulses, APS 110 may cause stand-by circuitry 112 to activate a stand-by mode, although the scope of the present invention is not limited in this respect.

In one particular embodiment, processor 314 may delay consecutive reads, for example for longer than a read time plus an internal delay of APS 110. In such an embodiment, a delay element 210 may be utilized to introduce a delay on cell select input 214 to provide a predetermined wait time before APS 110 causes stand-by circuitry 112 to activate a stand-by mode, although the scope of the present invention is not limited in this respect.

In one embodiment, APS 110 may include delay element 210, address transition detectors 212 and combinatorial logic, including NOR gate 221 and NAND gate 224. APS 110 may provide a signal to stand-by circuitry 112, for example a modified chip enable signal at an output of NAND gate 224. In such an embodiment, APS 110 may operate as an automatic control circuit to actuate stand-by circuit 112, although the scope of the present invention is not limited in this respect. As a result, APS 110 may lower the power consumption of flash array 100 when processor 314 is not using flash array 100. In one embodiment, the term using may mean changing the inputs of flash array 100 and waiting for a new output from flash array 100, although the scope of the present invention is not limited in this respect. As shown in FIG. 2, APS 110 may cause flash array 100 to automatically enter a stand-by mode without the processor sending a command to flash array 100. ATD circuits 212 may not output any pulses after processor 314 stops changing inputs to flash array 100, for example addresses at address pads 216. In one embodiment, when ATD circuits 212 are not generating pulses, flash array 100 may not be performing tasks. APS 110 on flash array 100 may automatically operate to cause flash array 100 to enter stand-by mode via stand-by circuitry 112 without requiring processor 314 to make an active decision to send a stand-by command to flash array 100, although the scope of the invention is not limited in this respect. It should be noted that in one embodiment of the invention, flash memory array 100 may be placed into a stand-by mode which may happen when processor 314 sends a specific command to flash memory array 100 to enter into a stand-by mode, for example via chip enable input 218, or flash memory array 100 may be automatically placed into a stand-by mode, for example in the absence of activity on address pads 216, or flash memory array 100 may be placed into a stand-by mode using a combination of a specific command and an automatic detection function, although the scope of the invention is not limited in this respect.

Referring now to FIG. 3, a block diagram of a wireless device or terminal that incorporates a flash memory array in accordance with one embodiment of the present invention will be discussed. A wireless device 300 may include a transceiver 310 coupled to an antenna 312. Wireless device 300 may be one or more of various wireless devices or terminals, including but not limited to a cellular telephone, a mobile computer, a personal digital assistant, and so on, although the scope of the invention is not limited in this respect. Wireless device 300 may include a processor 314 to execute programs to control and operate wireless device 300. Programs and/or data may be stored in a flash memory array 100 coupled to processor 314. In accordance with one embodiment of the present invention, flash memory array 100 may implement a power savings circuit, for example as shown in and described with respect to FIG. 2, to provide a power savings to wireless device 300, for example where wireless device may operate from battery power, although the scope of the invention is not limited in this respect.

Although the invention has been described with a certain degree of particularity, it should be recognized that elements thereof may be altered by persons skilled in the art without departing from the spirit and scope of the invention. It is believed that the automatic power savings stand-by circuit for non-volatile memory of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof, and further without providing substantial change thereto. It is the intention of the claims to encompass and include such changes.

What is claimed is:

1. An apparatus, comprising:
   a non-volatile memory array; and
   a power saving circuit to modify a chip enable signal that is to enable the non-volatile memory array in response to an absence of activity on an address input to said non-volatile memory array and to place said non-volatile memory array into a standby mode based on the modified chip enable signal.

2. An apparatus as claimed in claim 1, wherein said power saving circuit is configured to place said non-volatile memory array in a standby mode without requiring processor intervention.

3. An apparatus as claimed in claim 1, the address input including an address line of said non-volatile memory array.

4. An apparatus as claimed in claim 1, wherein the absence of activity includes an absence of address activity from a processor.

5. An apparatus as claimed in claim 1, wherein said power saving circuit to place said non-volatile memory array in a standby mode in the event of an absence of activity at an input to said non-volatile memory array after a predetermined period of time.

6. An apparatus as claimed in claim 1, said power saving circuit including:
   a delay element to receive a chip select signal for said non-volatile memory array;
   at least one address transition detector to detect an absence of activity on an address line of said non-volatile memory array; and
   a logic circuit to receive an output from the delay element and the at least one address transition detector, to provide the modified chip enable signal to control the standby mode.

7. The apparatus of claim 1, wherein said non-volatile memory array and said power saving circuit reside in a single flash memory array.

8. A method, comprising:
   determining whether a change on an address input to a non-volatile memory array is stopped; and
   in response to determining that the change is stopped, modifying a chip enable signal that is to enable the non-volatile memory array to place the non-volatile memory array into a standby mode based on the modified chip enable signal.

9. A method as claimed in claim 8, said modifying including providing a chip enable output to control the standby mode.

10. A method as claimed in claim 8, further comprising placing the non-volatile memory array into a standby mode without requiring a command provided by a processor.

11. A method as claimed in claim 8, further comprising determining whether the non-volatile memory array is selected, and executing said modifying when a chip select input indicates the non-volatile memory array is not selected.

12. A method as claimed in claim 8, further comprising determining whether the memory array is selected with a cell select input, introducing a delay on the cell select input, and executing said modifying when the cell select input indicates the non-volatile memory array is not selected.

13. A method comprising:
   in response to determining that there is an absence of activity on an address input to said non-volatile memory array and a cell select input indicates the non-volatile memory array is not selected, modifying a chip enable signal that is to enable a non-volatile memory array to provide a chip enable output; and
   providing the chip enable output to input of a standby circuit of a non-volatile memory array to cause the standby circuit to activate a standby mode for the non-volatile memory array.

14. A method as claimed in claim 13, further comprising introducing a delay on the cell select input.

15. An apparatus, comprising:
- a wireless transceiver;
- a non-volatile memory array; and
- a power saving circuit to control a standby mode of the non-volatile memory array, said power saving circuit to modify a chip enable input that is to enable the non-volatile memory array in an event there is no change on an address input to said non-volatile memory array and to activate the standby mode of said non-volatile memory array based on the modified chip enable input.

16. An apparatus as claimed in claim 15, said power saving circuit to control the operation of the standby mode without requiring processor intervention.

17. An apparatus as claimed in claim 15, said power saving circuit to provide a chip enable output to control the operation of the standby mode based on at least one or more of the modified chip enable input, an address input, and a cell select input provided to said non-volatile memory array.

18. An apparatus as claimed in claim 15, said power saving circuit to activate a standby mode when said power saving circuit detects an absence of activity on at least one input to said non-volatile memory array.

19. An apparatus as claimed in claim 15, said power saving circuit including at least one address transition detector for detecting an absence of activity on at least one input to said non-volatile memory array.

* * * * *